Oct. 9, 1951 W. G. PFANN 2,570,978

SEMICONDUCTOR TRANSLATING DEVICE

Filed Oct. 11, 1949 2 Sheets-Sheet 1

INVENTOR
W. G. PFANN
BY [signature]
ATTORNEY

Oct. 9, 1951 W. G. PFANN 2,570,978

SEMICONDUCTOR TRANSLATING DEVICE

Filed Oct. 11, 1949 2 Sheets-Sheet 2

INVENTOR
W. G. PFANN
BY [signature]
ATTORNEY

UNITED STATES PATENT OFFICE 2,570,978

SEMICONDUCTOR TRANSLATING DEVICE

William G. Pfann, Chatham, N. J., assignor to Bell Telephone Laboratories, Incorporated, New York, N. Y., a corporation of New York Application October 11, 1949, Serial No. 120,661

20 Claims. (Cl. 332—31)

This invention relates to semiconductor signal translating devices and more particularly to such devices of the general type disclosed in the applications Serial No. 33,466, filed June 17, 1948, of J. Bardeen and W. H. Brattain, now Patent No. 2,524,035 dated October 3, 1950, and Serial No. 35,423, filed June 26, 1948, of W. Shockley.

Devices of the type disclosed in the applications above identified may be utilized for the performance of a variety of electrical functions, such as amplification, generation and modulation of electrical signals. They comprise, generally, a body of semiconductive material having a pair of rectifying connections, designated as the emitter and collector, thereto and having also a large area or substantially ohmic connection, designated as the base, thereto. One or both of the emitter and the collector connections may comprise either a point contact or a barrier, designated as a PN junction, between semiconductive zones of opposite conductivity types. The emitter and collector are biased at suitable potentials relative to the base, the emitter in the forward direction and the collector in the reverse direction, whereby the emitter impedance is relatively low and the collector impedance is relatively high.

If the semiconductive body is of N-type material conduction in its interior is principally by electrons. The emitter current is constituted primarily by holes and the collector current is constituted primarily by electrons. The impedance at the collector connection is reduced by the attraction of holes from the emitter to the collector. If the semiconductive body is of P-type material, electrons are injected into the body at the emitter and are drawn to the collector. The emitter current is constituted primarily by electrons and the collector current is constituted largely by holes.

In devices utilized as amplifiers, the input may be impressed on the circuit between the emitter and the base and the output or load circuit may be connected between the collector and the base. Amplified replicas of input signals appear in the output or load circuit. The amplification may be in the form of a power gain either with or without current gain.

The current gain is attributable to a current multiplication measured by the factor $\alpha$ which is defined as $$\alpha=\left(\frac{\delta I_c}{\delta I_e}\right)$$

for a constant collector voltage, $I_c$ being the collector current and $I_e$ the emitter current. The explanation of current multiplication factors greater than unity is that the flow of one carrier to and collection thereof by the collector results in the flow of more than one carrier in the collector current. Specifically, and as an example, in the case of a device wherein the body is of N-type germanium, the collection of holes may result in the flow of additional electrons from the collector to the germanium.

One general object of this invention is to improve the performance characteristics of semiconductor signal translating devices.

More specifically, objects of this invention are to increase the current gain in such devices, increase the input impedance, and improve the performance of such devices as amplifiers and oscillators.

In one embodiment illustrative of this invention, a semiconductor signal translating device comprises a body of semiconductive material, such as germanium, having two contiguous zones of opposite conductivity type, that is a P zone and an N zone, separated by a barrier or junction, a base connection to one or both of these zones, and a pair of rectifying connections to the two zones on opposite sides of the barrier or junction.

In accordance with one feature of this invention both of the rectifying connections are biased, relative to the respective zone in the reverse direction. That is to say, the rectifying connection to the P zone is biased positively with respect thereto and the rectifying connection to the N zone is biased negatively with respect thereto. The current which flows through the positively biased connection is composed predominantly of holes and that which flows through the negatively biased connection is constituted primarily by electrons. Because of the biases on these two connections, each will attract the electrical carriers injected into the semiconductive body at the other connection so that in a sense each connection functions as an emitter with respect to the other. The carriers received by each connection from the other reduce the impedance at this connection and consequently increase the current flow thereat.

In accordance with another feature of this invention, the body and the rectifying connections thereto are constructed and arranged so that the space charge regions adjacent the rectifying connections extend into proximity to the barrier or junction over a substantial area of the latter, whereby only those electrical carriers emanating from one connection will be drawn across the barrier or junction to the other and substantial current multiplication is achieved.

In accordance with still another feature of this invention, in a device of the construction above described, an additional rectifying connection is provided to one of the zones, this connection being associated with the others to serve as an emitter and being biased in the reverse direction, whereby a high input impedance is realized.

The invention and the above-noted and other features thereof will be understood more clearly and fully from the following detailed description with reference to the accompanying drawings in which:

Fig. 1 is a diagram illustrating the basic elements and the general organization thereof in a signal translating device embodying this invention;

Figs. 2A to 2D, inclusive, are diagrams which will be referred to hereinafter in explaining certain aspects of the physics of the operation of devices constructed in accordance with this invention;

Figure 12:
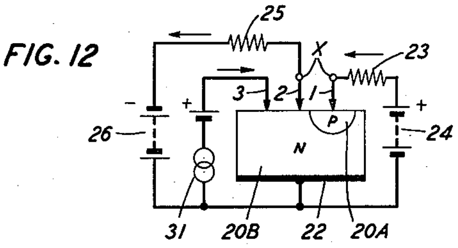
Figure 13:
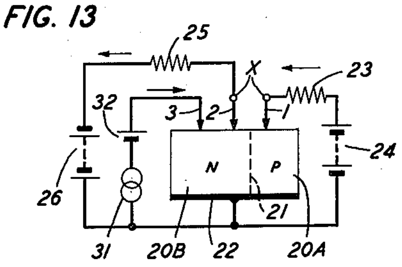
Figure 14:
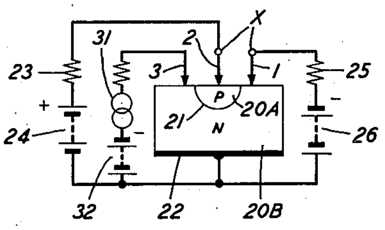
Figure 15:
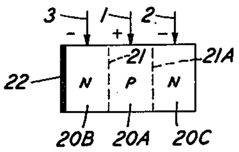
Figure 16:
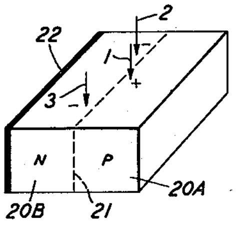

Figs. 10 to 13, inclusive, illustrate various embodiments of this invention wherein an additional emitter connection is made to one of the zones in the semiconductive body;

Fig. 14 is a diagram of a signal translating device illustrative of another embodiment of this invention similar to those illustrated in Figs. 10 to 13 and characterized by a high input impedance;

Fig. 15 is an elevational view illustrating a modification of the semiconductive body shown in Fig. 14; and Fig. 16 is a view in perspective of a semiconductive body and associated contacts which may be utilized in an amplifier such as illustrated in Fig. 14.

In the drawing for the sake of clarity the semiconductive bodies have been shown to a greatly enlarged scale. Typical dimensions of the block of semiconductive material in actual devices are of the order of .050 inch long, .050 inch wide and .020 inch thick.

Illustrative of the semiconductive materials which may be utilized in devices constructed in accordance with this invention are germanium and silicon. Suitable germanium material may be prepared in the manner disclosed in detail in the application Serial No. 638,351 filed December 29, 1945, of J. H. Scaff and H. C. Theuerer. The surface of the germanium body upon which the point contacts bear advantageously is treated as in the manner disclosed in the application Serial No. 67,797 filed December 29, 1948, of W. G. Pfann. Suitable silicon material may be prepared in the manner disclosed, for example, in Patent 2,402,661 granted June 25, 1946, to R. S. Ohl.

Contiguous zones of P-type and N-type material meeting at a junction or barrier may be produced in germanium by appropriate heat treatment of a homogeneous body of N-type material as disclosed in the Scaff-Theuerer application heretofore identified. Such zones may be produced also in other ways, for example by deuteron or alpha particle bombardment of one surface of a body of N-type germanium as disclosed in the application Serial No. 87,618, filed April 15, 1949, of G. L. Pearson and W. Shockley.

Figure 1:
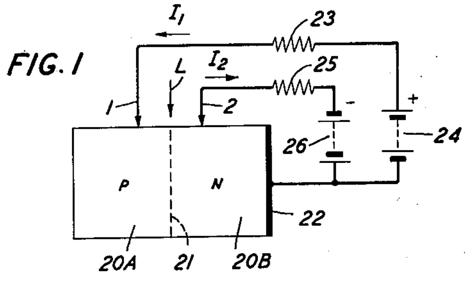

Referring now to the drawing, the signal translating device illustrated in Fig. 1 comprises two zones 20A and 20B respectively of P- and N-conductivity type as indicated in the figure. The two zones 20A and 20B meet at a junction or boundary 21.

One face of the N-type zone 20B has thereon a large area or substantially ohmic connection 22, for example a plating of rhodium or copper. A pair of point contacts 1 and 2, which may be, for example, of Phosphor bronze, bear against one face of the semiconductor body on opposite sides of the barrier 21 and in proximity thereto. For example, the spacing between the point contacts 1 and 2 may be of the order of a few thousandths of an inch.

A first circuit is connected between the point contact 1 and the base 22 and comprises an impedance, represented generally by the resistor 23, and a source 24 for biasing the point contact 1 positive with respect to the base. A second circuit is connected between the point contact 2 and the base 22 and comprises an impedance, represented generally by the resistor 25, and a source 26 for biasing the point contact 2 negative with respect to the base 22. It is to be noted particularly that both contacts 1 and 2 are biased in the reverse direction with respect to the zone against which each bears. Currents in the two circuits flow in the directions indicated by the arrows $I_1$ and $I_2$, the direction of current flow being conventional, that is, in the direction opposite to that of the flow of electrons.

The current which flows through the point contact 1 and into the P-type zone 20A is composed largely of holes whereas the current flowing to the point contact 2 from the N-type zone 20B is composed substantially entirely of electrons. Because of the polarities of the bias upon the point contacts, it will be noted that each point contact attracts the electrical carriers, holes or electrons, extant in the vicinity of the other point contact; that is to say, holes will be attracted toward the point contact 2 whereas electrons will be attracted toward and to the point contact 1. In a sense, therefore, each of the point contacts 1 and 2 acts in the nature of an emitter with respect to the other.

If the current $I_1$ increases, the number of holes injected into the semiconductive body through the point contact 1 increases. Some of these injected holes flow to and are collected by the point contact 2 whereby the electron current through the point contact 2 is increased. Some of the electrons in the vicinity of the point contact 2 flow to and are collected by the point contact 1.

As has been pointed out hereinbefore, the collection of holes at the point contact 2 may result in flow of additional electrons at this point contact whereby an electron multiplication occurs. Similarly, the collection of electrons at the point contact 1 may result in the flow of additional holes in the vicinity of the point contact 1 whereby a similar current multiplication is realized.

The process is repetitive and may result in the generation of oscillations the frequency of which will be determined by the impedances 23 and 25 and the impedance through the body between the point contacts 1 and 2. However, a condition of stability may be easily established. The correlation of parameters requisite to effect such stabilization will be apparent from the following analysis:

The current multiplication factor for the device, considering contact 2 as a collector and contact 1 as an emitter may be expressed as $$\alpha_{21}=\left[\frac{\delta I_2}{\delta I_1}\right]E_2=\text{constant}$$

$E_2$ being the voltage of the contact 2 relative to the base 22. Similarly, the current multiplication factor for the device considering contact 1 as the collector and contact 2 as the emitter may be expressed as $$\alpha_{12}=\left[\frac{\delta I_1}{\delta I_2}\right]E_1=\text{constant}$$

$E_1$ being the voltage of the contact 1 relative to the base 22. The two factors $\alpha_{21}$ and $\alpha_{12}$ may, but need not necessarily, be equal.

Over a range of currents, these factors may be considered as constant. Assuming for the moment that the impedances 23 and 25 are zero, the ratio of the change in $I_2$ due to a change in $I_1$ will be $$\alpha_{21}=\frac{\Delta I_2}{\Delta I_1}$$

For an increment of unity in $I_1$, the values of $\Delta I_1$ and $\Delta I_2$ will be $$\Delta I_1=1+K+K^2+K^3+\quad .\ K^{\infty}=\frac{1}{1-K}$$

for $$K<=1$$

and $$\Delta I_2=\alpha_{21}\Delta I_1=\frac{\alpha_{21}}{1-K}$$

where $$K=(\alpha_{12})(\alpha_{21})$$

Thus, in order for self-oscillation of the device to obtain, K must be equal to or greater than unity. By similar analysis it follows that if the impedances 23 and 25 are positive, the condition for self-oscillation is that K be greater than unity.

The requisite value of K may be obtained in any device by proper treatment of one or both of the contacts 1 and 2. In general, the $\alpha$ obtainable for an unformed point contact is less than 1. However, by forming the contact 2, which bears against the N-type zone 20B as in the manner disclosed in the application of W. G. Pfann identified hereinabove, $\alpha_{21}$ may be made greater than unity.

Figures 2A, 2B, 2C, 2D:
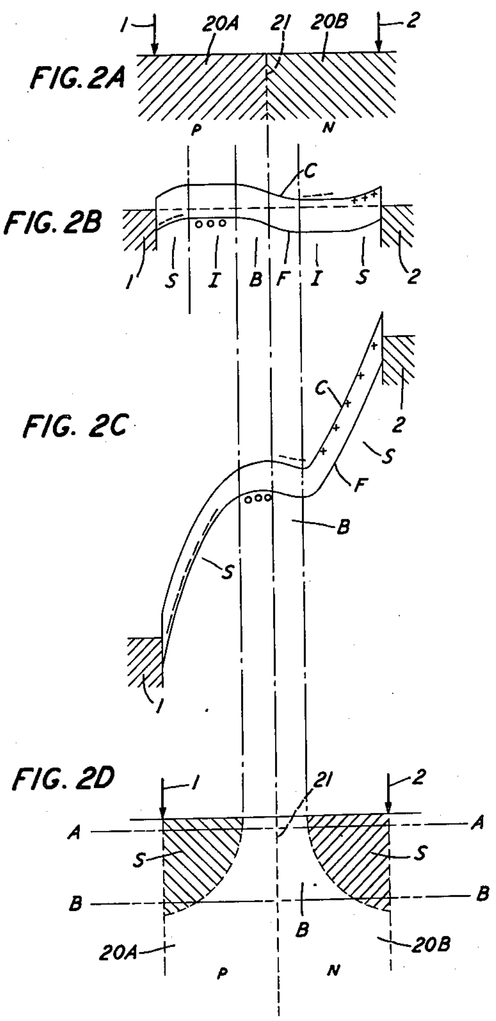

The operation of a device of the construction illustrated in Fig. 1 may be explained by consideration of the fields extant in the semiconductive body at and in the vicinity of the face of this body against which the point contacts bear. These are illustrated in Figs. 2B and 2C which are aligned vertically and correspond horizontally with Fig. 2A, the latter being a diagrammatic representation of a top portion of the semiconductive body in the device of Fig. 1. In Figs. 2B and 2C, the upper line C represents the bottom of the conduction band and the lower line F represents the top of the filled band in the semiconductor.

Fig. 2B portrays the energy contours for the case where the bias on both of the point contacts 1 and 2 is zero. As shown, there are several distinct regions in the body between the point contact, namely the space charge region S about each of the contacts, the region B wherein the field across the PN boundary or junction obtains, and the intermediate regions I. When both point contacts are at zero bias, no current flows between these contacts and the fields in the intermediate regions I are zero as depicted in Fig. 2B.

When the point contacts are biased as illustrated in Fig. 1, the energy contours are of the form depicted in Fig. 2C. As shown in this figure, each space charge region S extends to the barrier or junction region B. This is presented pictorially in Fig. 2D wherein the general form of the space charge region is depicted by the shaded areas S. The fields near the surface of the semiconductor, such as at line A—A in Fig. 2D, clearly are such that holes will flow from the zone 20A across the PN junction and to the contact 2 and electrons from the zone 20B will flow across the junction to the contact 1.

As has been pointed out hereinabove, the flow of holes to the contact 2 results in an increase in the number of electrons liberated at this contact and a consequent increase in the number of electrons which flow to the contact 1 and attendant increase in the number of holes liberated at this contact. The process of current multiplication at both of the point contacts is repetitive.

It will be understood that in a device such as illustrated in Fig. 1, the output may be taken from across one or both of the impedances 23 and 25. Furthermore, it will be noted that the variations in voltage across these two impedances are 180 degrees out of phase. Thus, the output signals across the two may be utilized in push-pull relation, as described hereinafter.

Moreover, the output of the device may be modulated by directing a beam of light of varying intensity, indicated by the arrow L in Fig. 1, against the barrier or junction 21. Such a beam of light results in the production, at the surface of the semiconductive body, of electron-hole pairs of number proportional to the light intensity. Thus, the electron and hole currents to the respective point contacts are varied in accordance with the intensity of the light beam.

Figure 5:
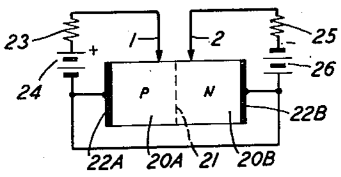
Figs. 5, 6 and 7 are diagrams similar to Fig. 1 illustrating various modifications of the device shown in Fig. 1.
Figure 6:
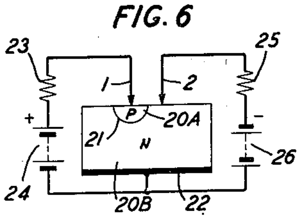
Figure 7:
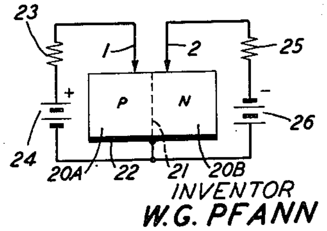

Several modifications of the basic combination illustrated in Fig. 1 and described hereinabove are shown in Figs. 5, 6 and 7, a principal modification being in the relation of the base connection and the zones and barrier. In the embodiment of the invention shown in Fig. 5, two base electrodes 22A and 22B are provided on opposite faces of the semiconductive body, i. e. a base connection is made to both zones.

In the embodiment of the invention illustrated in Fig. 6, the P-type zone 20A is in the form of an island in the N-type body 20B. The P-type 20A may be produced for example, by bombardment of one face of the N-type body with deuterons or alpha particles. The base connection, as shown in Fig. 6, may be made to the face of the body opposite that against which the point contacts 1 and 2 bear.

The embodiment of the invention illustrated in Fig. 7 is similar to that in Fig. 1, except that the base connection 22 is made to the face of the semiconductive body opposite that against which the point contacts 1 and 2 bear.

Figure 3:
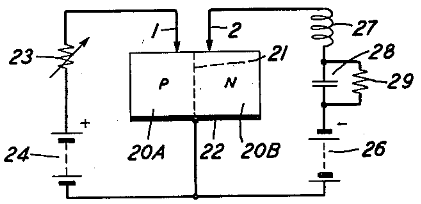
Figs. 3 and 4 are diagrams of typical oscillation generating devices embodying this invention.

Fig. 3 portrays an oscillator illustrative of one embodiment of this invention wherein the circuit between the point contact 2 and the base 22 includes an inductance and capacitance 28 correlated to determine the oscillating frequency, the capacitance 28 being shunted by a suitable resistor 29. The output voltage may be taken from across either the inductance 27 or the capacitance 28. The resistor 23 in circuit with the point contact 1 may be omitted or may be utilized to control the output voltage.

Figure 4:
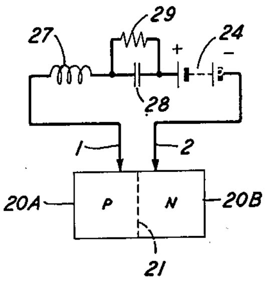

In the oscillator illustrated in Fig. 4, the frequency determining inductance 27 and capacitance 28 are connected in series between the point contacts 1 and 2 together with the source 24 for biasing each of the contacts 1 and 2 in the reverse direction with respect to the corresponding zone 20A or 20B of the semiconductive body. As in the device illustrated in Fig. 3, in the oscillator shown in Fig. 4 the output voltage may be taken from across either the conductance 27 or the capacitance 28.

As is apparent from Fig. 2D, the field in the vicinity of the barrier or junction 21 may vary with depth from the face against which the point contacts 1 and 2 bear. At and in the immediate vicinity of this face, for example above the region marked by the line AA, the fields are relatively strong whereas at the region in the vicinity of the line BB the fields are relatively weak. At the region in the vicinity of the line BB the fields may draw holes from the P region 20A to the N region 20B and electrons in the reverse direction. However, this flow of carriers will be relatively insensitive to changes in currents $I_1$ and $I_2$ inasmuch as most of the carriers will originate in and come from the body of the semiconductor.

Figure 8:
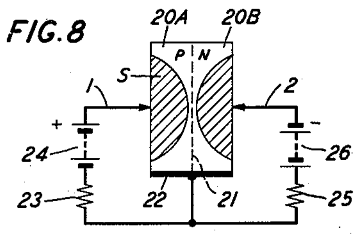
Fig. 8 is a diagram illustrative of another embodiment of this invention wherein the contacts and semiconductive body are cooperatively associated to produce a substantially optimum relation between the space charge regions and the PN junction or barrier.

It is desirable for most effective operation that only carriers originating in the vicinity of each of the point contacts 1 and 2 be drawn across the barrier or junction 21 to the other point contact. This may be realized if the space charge regions S about the point contacts approach the barrier region B over a large area. One construction for achieving such condition is illustrated in Fig. 8. In the device illustrated in this figure, the point contacts 1 and 2 are aligned and bear against opposite faces of the semiconductive body so that, as illustrated in the figure, the space charge regions S have large areas in proximity to the junction or barrier 21. In devices of the construction illustrated in Fig. 8, the body should be very thin affording a spacing of the order of .004 inch between the contacts 1 and 2.

Figure 9:
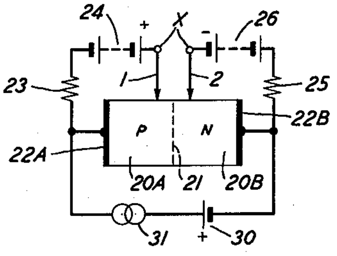
Fig. 9 illustrates the general cooperative relation of the principal elements in a device embodying this invention and particularly suitable for use as an amplifier.

The embodiment of this invention illustrated in Fig. 9 is similar to that shown in Fig. 5 but includes a source 30 connected between the base electrodes 22A and 22B, the source 30 having in series therewith a signal source 31. As shown, the source 30 is poled in the direction such that holes from the P-type region 20A are drawn into the N-type zone 20B, and conversely, electrons from the zone 20B are drawn across the barrier 21 into the P zone 20A. The signal applied by the source 31 modulates both the hole and electron currents. Advantageously, in order to assure flow of a large proportion of the carriers from either contact to the other the thickness of the semiconductive body at the barrier should be small, for example, the thickness of the body at this region may be of the order of .005 inch and realized either by making the body of this thickness or by reducing the thickness of the body in the vicinity of the junction or barrier 21. Oppositely phased output voltages are produced at the points X.

Figure 10:
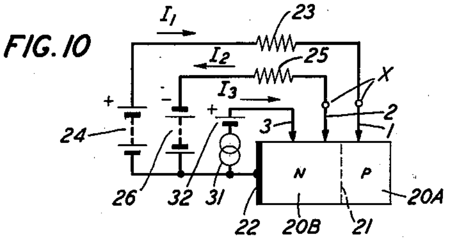

The device illustrated in Fig. 10 includes four electrodes and, as is apparent, is similar to that shown in Fig. 1. However, it includes, in addition, a third point contact 3, for example of Phosphor bronze, bearing against the N zone 20B and in proximity to the point contact 2. The contact 3 is biased at a small potential in the forward direction by the direct-current source 32. Signals are impressed between the contact 3 and base 22 from the input source 31.

The point contact 3 functions as an emitter with respect to the contact 2 in the manner described in detail in the application of J. Bardeen and W. H. Brattain identified hereinabove, whereby a change in the emitter current $I_3$ produces a greater change in the current $I_2$, i. e. whereby a current gain is realized. By the interaction between the contacts 1 and 2 in the manner described hereinabove, a further current gain is realized. If the impedances or resistors 23 and 25 are equal, e. g. zero or positive and $\alpha_{12}$ equals 1, equal and oppositely phased voltages will be produced at the points X. These may be utilized in obvious ways for push-pull amplifier operation.

For greatest current gain $\alpha_{23}$ should be large and $K_{21}=\alpha_{21}\alpha_{21}$ should be somewhat less than unity. The overall multiplication factor, $\alpha_T$, may be expressed as $$\alpha_T=\frac{\Delta I_1}{\Delta I_3}=\frac{\alpha_{23}\alpha_{12}}{1-K_{21}}$$

In the device illustrated in Fig. 10, it will be noted that the contact 3 is biased in the forward direction whereas the contacts 1 and 2 are biased in the reverse direction. Thus the input impedance is low and the output impedance is high whereby a power gain as well as a current gain may be realized.

Figure 11:
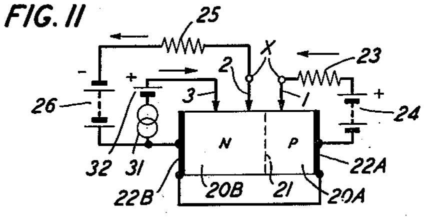

Figs. 11, 12 and 13 illustrate modifications of the device shown in Fig. 10 and describe hereinabove and are basically similar thereto, a principal difference being in the base connection, e. g. to one or both zones, to both zones and the barrier, to both zones but not to the barrier, etc. Specifically, in the device of Fig. 11, two base connections 22A and 22B are provided; in the device of Fig. 12, the P zone 20A is an island in the N body 20B and the base 22 is on the face of the body 20B opposite that against which the contacts bear, in the device of Fig. 13, the base 22 is on the face of the semiconductive body opposite that against which the contacts bear.

The devices shown in Figs. 10 to 13, similarly to those illustrated in Fig. 1 and in the modifications thereof, are photosensitive, that is the output current can be controlled by a beam of light directed against the PN junction or boundary. Thus, these devices may be operated as photoamplifiers, with the source 31 omitted, or as modulators, with both the source 31 and the light beam used to vary the output current.

In some applications, for example in amplifiers, it is advantageous that the ratio of the input impedance to the output impedance of the device be large. The large current multiplication factor obtainable with devices constructed in accordance with this invention enables attainment of this desideratum without substantial sacrifice of power gain. Specifically, as illustrated in Fig. 14, a high input impedance is obtained by placing the emitter 3 on the opposite side of the boundary 21 from the associated collector 1 and biasing the emitter in the reverse direction. For greatest current multiplication in the device illustrated in Fig. 14, as in the device illustrated in Figs. 10 to 13, $K_{21}$ should be slightly less than unity.

The PN boundaries or junctions in high input impedance devices such as illustrated in Fig. 14 may be separate or different parts of the same one. For example, in the form illustrated in Fig. 15, the semiconductive body comprises three zones 20A, 20B and 20C forming two PN junctions or boundaries 21 and 21A, each point contact bearing against a respective zone and biased in the reverse direction as indicated. In the form illustrated in Fig. 16, the semiconductive body has a single boundary or junction 21 therein, with the point contacts 3 and 2 to one side of the junction and the contact 1 to the other side thereof. All three contacts are biased in the reverse direction as indicated in Fig. 16.

Although specific embodiments of this invention have been shown and described, it will be understood, of course, that they are but illustrative and that various modifications may be made therein without departing from the scope and spirit of this invention.

What is claimed is:

1. A translating device comprising a body of semi-conductive material having therein two zones of opposite conductivity type meeting at a barrier, a base connection to said body, a pair of rectifying connections, one to each of said zones, and means biasing each of said connections in the reverse direction relative to the respective zone.

2. A translating device in accordance with claim 1 comprising means for directing a modulated beam of energy against said barrier.

3. A translating device comprising a body of semi-conductive material having therein two zones of opposite conductivity type meeting at a junction, a pair of point contacts bearing against said body on opposite sides of said junction and in proximity thereto, and means biasing each of said contacts in the reverse direction relative to the zone against which it bears.

4. A translating device in accordance with claim 3 wherein said body is of germanium.

5. A translating device comprising a body of semi-conductive material having therein two zones of opposite conductivity type meeting at a barrier, a base connection to said body, a pair of collector connections, one to each of said zones, in proximity to said barrier, an emitter connection to one of said zones, means biasing each of said collector connections in the reverse direction relative to the respective zone, and an input circuit connected between said emitter and base connections.

6. A translating device in accordance with claim 5 comprising means biasing said emitter connection in the reverse direction relative to the zone associated therewith.

7. A translating device comprising a body of semi-conductive material having therein two contiguous zones of opposite conductivity type, a pair of rectifying connections, one to each of said zones, a tuned circuit coupled to said rectifying connections, and means biasing each of said connections in the reverse direction relative to the respective zone.

8. A translating device comprising a body of semi-conductive material having therein two contiguous zones of opposite conductivity type, a pair of rectifying connections, one to each of said zones, a base connection to said body, a tuned circuit connected between said base connection and one of said rectifying connections and including means for biasing said one rectifying connection in the reverse direction, and a second circuit connected between said base connection and the other of said rectifying connections and including means biasing said other rectifying connection in the reverse direction.

9. A translating device comprising a body of semi-conductive material having two contiguous zones of opposite conductivity type, a pair of point contact connections, one to each of said zones, and a tuned circuit connected between said connections and including a source poled to bias each point contact connection in the reverse direction relative to the respective zone.

10. A signal translating device comprising a body of semiconductive material having two zones of opposite conductivity type meeting at a junction, a pair of point contacts bearing against one face of said body, on opposite sides of said junction and in proximity thereto, and means biasing each of said contacts in the reverse direction relative to the zone against which it bears.

11. A signal translating device comprising a body of semiconductive material having two contiguous zones of opposite conductivity type, each zone extending to a respective one of two opposite faces of said body, a pair of rectifying connections, each to a respective one of said opposite faces, and means biasing each of said connections in the reverse direction relative to the respective zone.

12. A translating device comprising a wafer of semiconductive material divided into two contiguous transverse zones of opposite conductivity type, a base connection to the periphery of said wafer, a pair of aligned point contacts bearing against opposite faces of said wafer, and a pair of circuits each connected between said base connection and a respective one of said point contacts, each of said circuits including means biasing the respective point contact in the reverse direction relative to the zone against which it bears.

13. A translating device comprising a body of semiconductive material having a pair of zones of opposite conductivity type meeting at a barrier, a pair of rectifying connections, one to each of said zones, means biasing each of said connections in the reverse direction relative to the respective zone, and means for modulating the flow of electrical carriers across said barrier.

14. A translating device comprising a body of semiconductive material divided into two zones of opposite conductivity type by a barrier, a pair of rectifying connections, one to each of said zones, a pair of base connections, one to each of said zones, means connected between each rectifying connection and the corresponding base connection for biasing the rectifying connection in the reverse direction relative to the respective zone, and means for impressing a signal between said base connections.

15. A translating device comprising a body of semiconductive material having two contiguous zones of opposite conductivity type, a pair of closely spaced rectifying connections, each to a respective one of said zones, means biasing each of said connections in the reverse direction with respect to the zone associated therewith, and means for injecting electrical carriers into one of said zones at a region in proximity to the rectifying connection to said one zone.

16. A translating device comprising a body of semiconductive material having two zones of opposite conductivity type meeting at a junction, a pair of rectifying connections to said body on opposite sides of said junction and in proximity thereto, means biasing each of said connections in the reverse direction with respect to the corresponding zone, and means for injecting electrical carriers into one of said zones comprising an additional rectifying connection to said one zone.

17. A translating device comprising a body of semiconductive material having therein a P zone and an N zone meeting at a barrier, a pair of rectifying connections, one to each of said zones and in proximity to said barrier, means biasing each of said connections in the reverse direction relative to the associated zone, and an emitter connection to said N zone.

18. A translating device in accordance with claim 17 wherein said material is germanium.

19. A translating device comprising a body of semiconductive material having a P zone and an N zone meeting at a junction, a base connection to said body, a pair of point contacts each bearing against a respective one of said zones in proximity to said junction, source means connected between said base connection and said contacts for biasing each contact in the reverse direction relative to the respective zone, an emitter connection to said N zone, and an input circuit coupled to said base and emitter connections and including means biasing said emitter connection in the reverse direction.

20. A translating device comprising a body of semiconductive material having a P zone between two N zones and contiguous therewith, a first rectifying connection to said P zone, a second rectifying connection to one of said N zones, means biasing each of said first and second connections in the reverse direction relative to the zone associated therewith, an emitter connection to the other N zone, and means biasing said emitter connection in the reverse direction relative to said other N zone.

WILLIAM G. PFANN.

REFERENCES CITED

The following references are of record in the file of this patent:

UNITED STATES PATENTS

| Number | Name | Date |
|---|---|---|
| 1,745,175 | Libienfeld | Jan. 28, 1930 |
| 1,930,536 | Piersol | Oct. 17, 1933 |
| 2,402,661 | Ohl | June 25, 1946 |
| 2,476,323 | Rack | July 19, 1949 |
| 2,486,776 | Barney | Nov. 1, 1949 |